United States Patent [19]

Tsukakoshi

[11] Patent Number: 4,942,342
[45] Date of Patent: Jul. 17, 1990

[54] PARALLEL SWEEPING SYSTEM FOR ELECTROSTATIC SWEEPING ION IMPLANTER

[75] Inventor: Osamu Tsukakoshi, Hiratsuka, Japan

[73] Assignee: Nihon Shinku Gijutsu Kabushiki Kaisha, Chigasaki, Japan

[21] Appl. No.: 243,614

[22] Filed: Sep. 12, 1988

[30] Foreign Application Priority Data

Sep. 30, 1987 [JP] Japan .................................. 62-243690
Jun. 20, 1988 [JP] Japan .................................. 63-150075

[51] Int. Cl.$^5$ ............................................. H01J 29/74
[52] U.S. Cl. ...................................... 315/410; 315/14; 313/432
[58] Field of Search ................. 315/410, 14; 313/432, 313/436, 439; 250/396 R, 492.3

[56] References Cited

U.S. PATENT DOCUMENTS 3,753,034  8/1973  Spicer ............................ 250/396 R
4,315,153  2/1982  Vahrenkamp .................. 250/396 R Primary Examiner—Theodore M. Blum
Attorney, Agent, or Firm—Hugh Adam Kirk

[57] ABSTRACT

A parallel sweeping system for electrostatic sweeping ion implanters comprising an ion source for generating an ion beam, first and second multipole beam deflectors along and around a common optical axis and a target wafer to be raster-scanned by the deflected beam. The two deflectors have the same number of electrodes of five or more and have similar configurations. One electrode of the first deflector is paired with an electrode of the second deflector in the same plane common with the optical axis, but on the opposite side of the optical axis. The same sweeping voltage is applied simultaneously to each electrode of a pair in the same plane and predetermined different voltages to each pair of electrodes. Thus, a substrate is constantly raster-scanned by means of parallel ion beams with predetermined direction, namely raster-scanned with the ion beam all over a large wafer with exact parallelism to the optical axis.

4 Claims, 4 Drawing Sheets

PARALLEL SWEEPING SYSTEM FOR ELECTROSTATIC SWEEPING ION IMPLANTER

FIELD OF THE INVENTION

The present invention relates to a parallel sweeping system for an electrostatic sleeping ion implanter.

BACKGROUND OF THE INVENTION

As the miniaturization of a wafer procedes and the width of a pattern to be formed on the wafer is narrowed in an ion implantation shadowing becomes a problem. For a CMOS (complementary metal oxides semiconductor) DRAM (Dynamic Random Access Memory) having 4M bits or more, thus, it is necessary to ion implant the whole surface of a wafer in a predetermined direction with an allowable range of 0.5°. More specifically, as the wafer is increased in its diameter to 6 or 8 inches and its capacity to 4M or 16M bits, and thus the width of the pattern is reduced, it is desired that the ion implantation is performed by using a parallel ion beam. With a conventional raster scan type ion implanter having a deflector for scanning an ion beam, however, even if a distance between the deflector and the wafer to be ion implanted is 160cm, the maximum deflecting angle for a 6-inch wafer becomes $\alpha_{max} = 2.7°$.

In a conventional electrostatic X-Y sleeping type deflector system, an ion beam has a deflecting angle ( or sweeping angle ) except the center portion because the ion beam is raster-scanned in X and Y directions ( or repeatedly deflected ). Thus, when such ion beam is implanted to a flat wafer, it is to be implanted at an oblique angle to the wafer except the center portion thereof. This phenomenon causes a shadowing in the ion implantation to a semiconductor wafer to reduce its yield. Further, the uniformity of the ion implantation is deteriorated at the periphery portion of the wafer where the ion implanting angle becomes large on the surface of the wafer to which the ion beam is implanted in the oblique angle ion beam implantation, thus feasibly causing a channeling.

Then, there has been proposed a parallel sweeping system for implanting ions to a wafer in a predetermined direction by using two electrostatic deflectors, in which the ion beam is deflected at $\alpha°$ by the first electrostatic deflector, run at a distance L and then deflected at $-\alpha°$ by the second electrostatic deflector. FIGS. 1 and 2 show some examples of the conventional systems proposed heretofore for the parallel sweeping.

In FIG. 1, reference character A designates a first parallel flat plate deflector which comprises Y-axis sweeping electrode set A1 and X-axis sweeping electrode set A2, and reference character B designates a second parallel flat plate deflector which comprises Y-axis sleeping electrode set B1 and X-axis sleeping electrode set B2. An ion beam is swept in a Y-axis direction by applying a periodically varying electric field of triangular or sawtooth waves between the electrodes of the Y-axis sweeping electrode set A1 and then is swept in a X-axis direction by applying a periodically varying electric field of triangular or sawtooth waves between the electrodes of the X-axis sweeping electrode set A2 in the first parallel flat plate deflector A. In the second parallel flat plate detector B, the ion beam is similarly swept in the Y-axis and X-axis directions to implant the ions to the wafer in a predetermined direction.

The system illustrated in FIG. 2 comprises a first parallel flat plate quadruple pole deflector C and a second parallel flat plate quadruple pole deflector D.

In the above-mentioned conventional systems, each deflector has effective range narrower due to a disorder in the electric field at the edge portion. It is, therefore, necessary to increase the width of the scanning and thus the size of the electrodes. The deflector also has a deflecting distortion considerably increased. In the deflector of the rear stage, there arise drawbacks that it has an increased electric capacity, the triangular wave voltage becomes obtuse in case of high speed scanning, and it becomes difficult to design a scanning power source. The parallel scanning with the electrostatic deflection system may be achieved merely up to 2-inch wafer at present due to the drawbacks described above.

Therefore, an object of the present invention is to provide a parallel sweeping system for an electrostatic sweeping ion implantor which can eliminate the above-mentioned drawbacks and which can always implant an ion beam in a predetermined direction even to a 6-inch or larger wafer.

SUMMARY OF THE INVENTION

According to one aspect of the present invention, there is provided a parallel sweeping system for an electrostatic sweeping ion implantor comprising a first multiple pole electrostatic deflector for deflecting charged ion beams from an ion source, and a second multiple pole electrostatic deflector having a similar structure to said first multiple pole electrostatic deflector namely, the cross-sectional form and size, and length of its electrodes and spacing between them. In other words, all shapes of the second deflector are made with a constant magnification ratio to the first deflector. This second deflector is disposed coaxially at the rear of said first multiple pole electrostatic deflector for deflecting the charged ion beams deflected by said first multiple pole electrostatic deflector in a predetermined directions. Each of said first and second multiple pole electrostatic deflectors has a plurality of electrodes, the same voltages are applied to the electrodes in said first and second multiple pole electrostatic deflectors which are disposed symmetrical with resect to a central axis. Thus a substrate or wafer is constantly raster scanned by means of the parallel charged ion beams with the predetermined direction, namely with exact parallelism to the optical axis.

Preferably, each of the first and second multiple pole electrostatic deflectors may be an octapole electrostatic deflector.

In the parallel sweeping system for an electrostatic sleeping ion implantor according to the present invention, the ion beam is first deflected at an angle by the first multiple pole electrostatic deflector, passed through a drift space defined between the first and second deflectors, and then introduced into the second deflector. The ion beam introduced into the second deflector is deflected counterwise by the angle equal to the deflection angle at the exit of the first deflector in absolute value and is in a direction reverse to the deflecting direction with the first deflector. Thus the ion beams have a propagating irradiated from the second deflector to be incident to the substrate. Thereby a parallel sweeping of the substrate can be performed.

The above and other objects, features, and advantages of the invention will be apparent upon consider-

DETAILED DESCRIPTION

Figure 1:
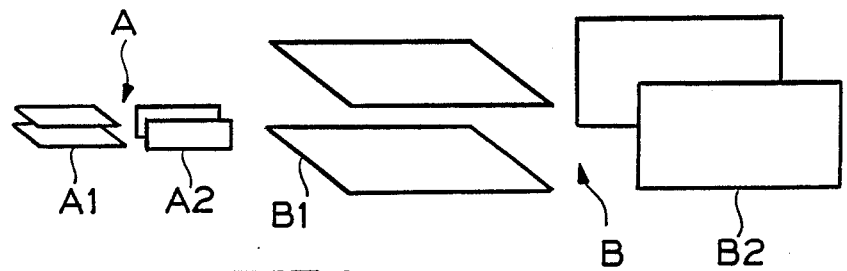
FIG. 1 is a schematic view of a conventional parallel flat plate deflector.
Figure 2:
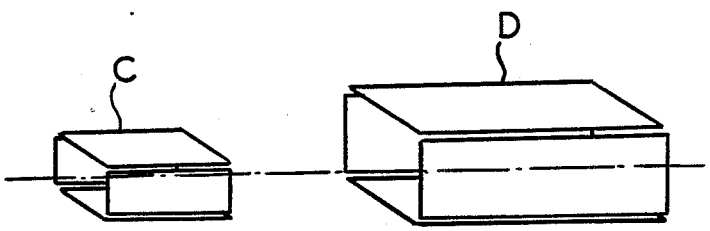
FIG. 2 is a schematic view of a conventional parallel flat plate quadruple deflector.
Figure 3:
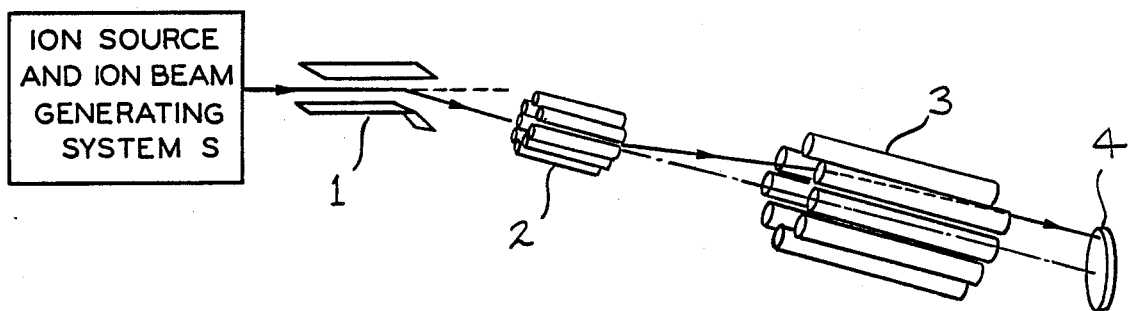
FIG. 3 is a schematic perspective view showing an embodiment of the present invention.

Reference is now made to FIG. 3 of the drawings wherein an embodiment of the present invention is illustrated.

In FIG. 3, reference numeral 1 designates a deflector with a constant deflecting angle made of parallel flat plate electrodes for trapping neutral particles included in charged ion beams from ion source and ion beam generating system S. Reference numeral 2 is to a first octapole electrostatic deflector having a central axis in a direction of the ion beams deflected at the predetermined angle by the deflector 1. Reference numeral 3 is to a second octapole electrostatic deflector having similar structure to that of the first octapole electrostatic deflector 2, but a size larger than that of the first one as will be described by illustrating an example. The reference numeral 4 is to a wafer to be ion implanted.

Figure 4:
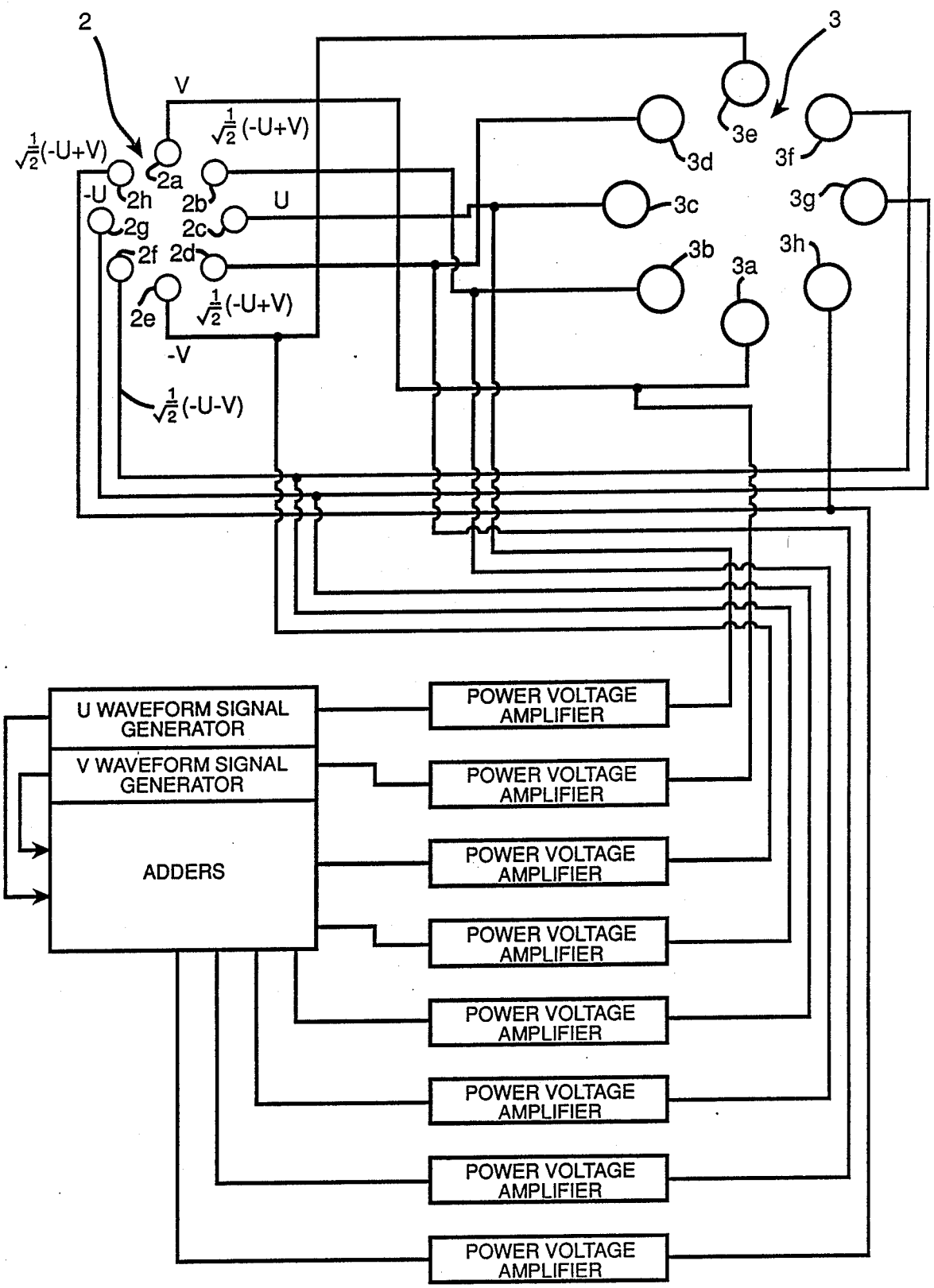
FIG. 4 is a schematic diagram showing how electrodes are electrically connected and a voltage is applied thereto.

The first and second octapole electrostatic deflectors 2 and 3 comprise eight cylindrical electrodes $2a$ to $2h$ and $3a$ to $3h$, respectively. The electrodes $2a$ to $2h$ and $3a$ to $3h$ in the first and second deflectors 2 and 3 are electrically connected as shown in FIG. 4. More specifically, each of the electrodes of the first octapole electrostatic deflector 2 is connected to the corresponding electrode of the second octapole electrostatic deflector 3 which is disposed in the same geometrical plane including the common optical axis, but on the opposite side of the central common optical axis. These electrodes of the first and second octapole electrostatic deflectors 2 and 3 are supplied with voltages as shown by eight wave voltage amplifiers or power sources controlled by a U wave form signal generator and a V wave form signal generator and adders.

Figure 5:
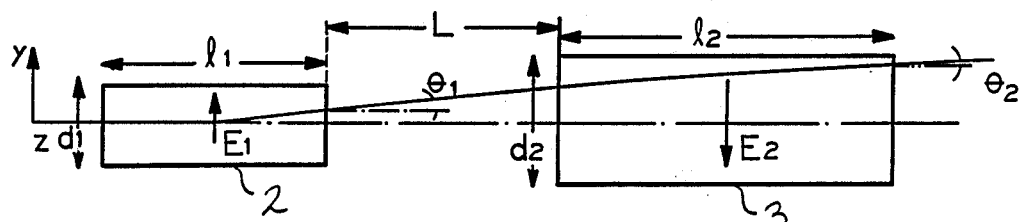
FIG. 5 is an explanatory view of a principle of parallel sweeping.

The operation of the illustrated parallel sweeping system will be described with reference to FIG. 5. As shown in FIG. 5, it is assumed that the first octapole electrostatic deflector 2 has a diameter d1 and a length l1, the second octapole electrostatic deflector 3 has a diameter d2 and a length l2, the distance between the first and second deflectors 2 and 3 is designated by L, an electric field in the first deflector 2 is designated by E1, an electric field in the second deflector 3 is designated by E2, the ion beams have irradiating angles (deflecting angles) $\theta 1$ at the outlet side of the first deflector 2 and $\theta 2$ at the outlet side of the second deflector 3, and the ions before entering the first deflector 2 have an energy UO. There is obtained the following equations:

$$\tan \theta 1 = E1 l1/2UO$$

$$\tan \theta 2 = E1 l1/2UO - E2 l2/2UO \tag{1}$$

In this case, if the following relation is satisfied, $$E1 l1/2UO = E2 l2/2UO \tag{2}$$

there is obtained $\tan \theta 2 = 0$, and conditions for the parallel sweeping can be provided.

The first and second deflectors 2 and 3 are similar in the configuration, and as shown in FIG. 4, when a voltage V is applied to the electrode $2a$ of the first deflector 2 and the electrode $3a$ of the second deflector 3, $1/¢2$ (U + V) is applied to the electrode $2b$ of the first deflector 2 and the electrode $3b$ of the second deflector 3, U is applied to the electrode $2c$ of the first deflector 2 and the electrode $3c$ of the second deflector 3 and so on, the electric fields E1 and E2 are parallel to each other but have opposite directions, and then the electric fields E1 and E2 are represented by the following equations:

$$E1 = \lambda V/d1, \; E2 = \lambda V/d2 \tag{3}$$

From the equations (2) and (3), the following relation may be derived:

$$\lambda V/UO \cdot l1/d1 = \lambda V/UO \cdot l2/d2$$

Since the first and second deflectors 2 and 3 are similar in the configuration, the following relation may be obtained:

$$l1/d1 = l2/d2 \tag{4}$$

Multiplying both the terms of the relation (4) by $\lambda V$, the following relation may be obtained:

$$\lambda V \cdot l1/d1 = \lambda V \cdot l2/d2$$

Therefore, there may be obtained $E1 l1 = E2 l2$, and thus the parallel sweeping conditions of the equation (2) may be satisfied.

Figure 6:
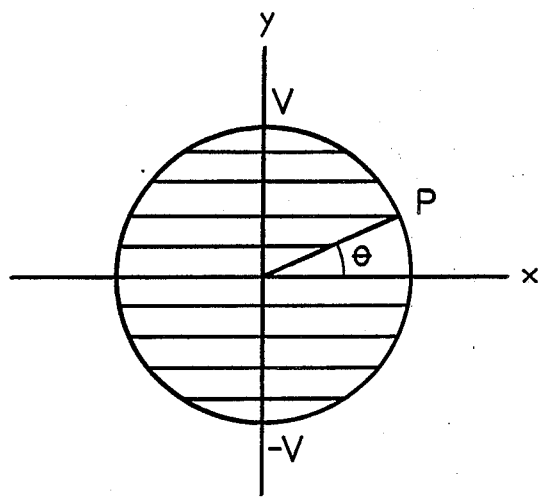
FIG. 6 is an explanatory view how the voltage is applied to the electrodes.

With reference to FIG. 6, it will be described how and what voltages are to be applied to the respective electrodes of the first and second deflectors in order to generate a uniform electric field V/ro in a-y-axis direction. In FIG. 6, it is assumed that the deflector has a cylindrical section to the periphery of which potentials are applied.

Considering the radius OP forming an angle $\theta$ with respect to the x-axis direction, the following relation may be provided.

$$\phi = V/rO \cdot rO \sin \theta = V \sin \theta$$

where $\phi$ is the potential on the point P. More specifically, when the potential as designated by V sin $\phi$ is given to the periphery of the deflector, a uniform electric field V/r0 may be formed in the-y-axis direction in the cylindrical deflector. Similarly, when the potential U cos 8 is given to the periphery of the deflector, a uniform electric field U/rO may be formed in the -x-axis direction in the cylindrical deflector. Then, the potential distribution such as $V \sin \theta + U \cos \theta$ is given to the periphery of the deflector, there may be obtained a uniform electric field E which consists of the superimposed-x-axis direction field component $V/rO$ and-y-axis direction field component $U/rO$.

With the octapole deflectors of the illustrated embodiment, $V \sin \theta + U \cos \theta$ becomes as shown in FIG. 4.

Figure 7:
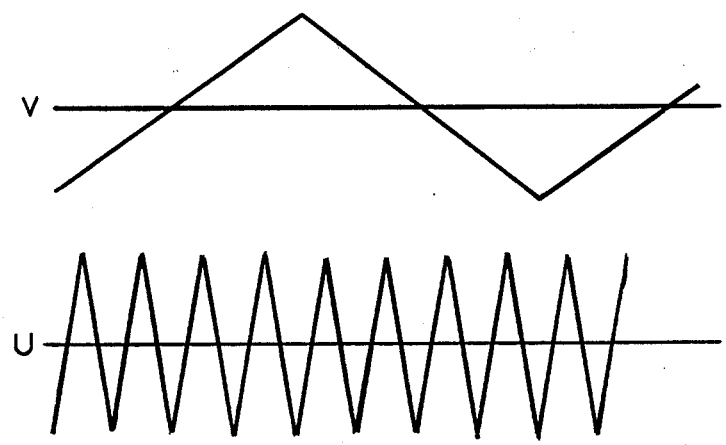
FIG. 7 is a diagram showing the voltage waveforms which are applied to the electrodes.

FIG. 7 shows an example of the voltage waveforms V and U, and these voltage waveforms V and U may be combined by an adder so as to produce $1/\sqrt{2}(U+V)$ or the like.

Then, the actual numeric values of the respective portions in the illustrated system will now be exemplified.

When the radius of the second octapole electrostatic deflector is rO and its portion up to 0.8 rO is effectively used without deflecting distortion, d2 becomes (6 inches + 1 cm × 2) = 21.25 cm in case 6-inch wafer is swept with 1 cm of overscanning.

Example 1

$l1 = 20$ cm,    $d1 = 4$ cm
$l2 = 106.25$ cm,    $d2 = 21.25$ cm
$L = 56.88$ cm,    $E1 = 5/4$ $KV$/cm

Example 2

$l1 = 15$ cm,    $d1 = 4$ cm
$l2 = 79.69$ cm,    $d2 = 21.25$ cm
$L = 59.3$ cm,    $E1 = 7.5/4$ $KV$/cm

Figure 8:
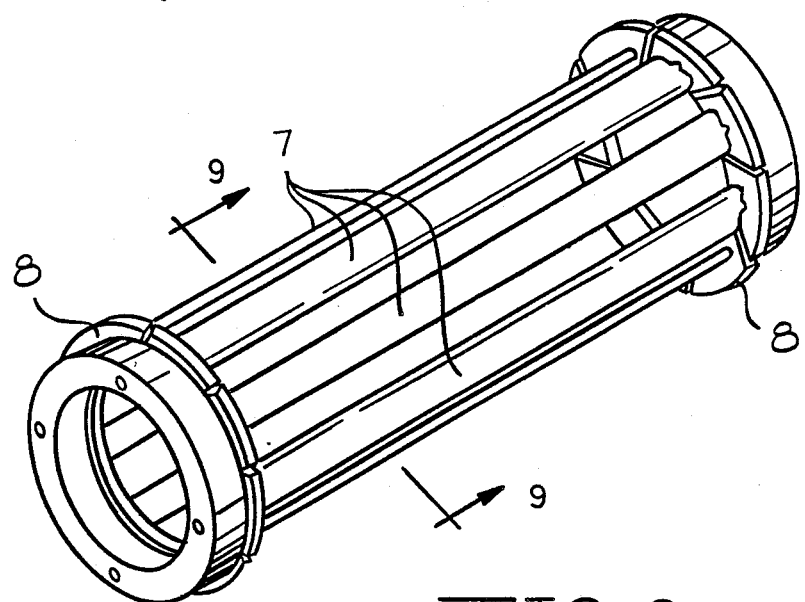
FIG. 8 is a schematic perspective view showing a further embodiment of the present invention.
Figure 9:
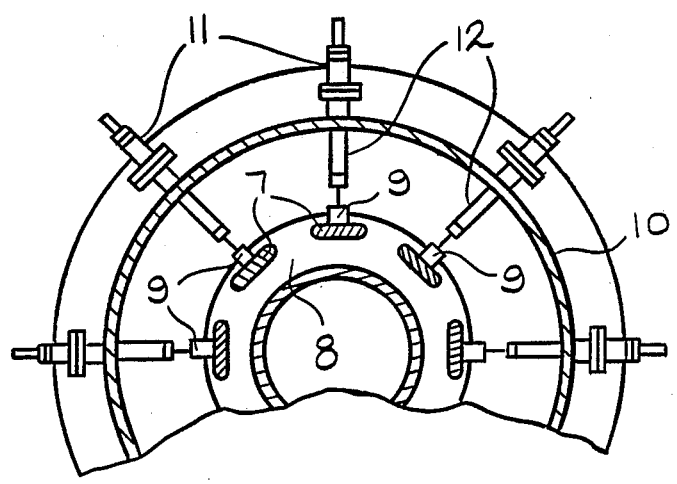
FIG. 9 is an enlarged sectional view along lines 9—9 showing an arrangement of the electrode assembly shown in FIG. 9 plus their supports.

FIGS. 8 and 9 show a preferable embodiment of each octapole electrostatic deflector in which each electrode 7 has a rectanguler cross section with rounded corners and is made of aluminum. The ends of the electrodes 7 are fixed to insulating rings 8 of glass epoxy resin so that the electrodes 7 are positioned with equal spacing between the adjacent electrodes.

As shown in FIG. 9, on the outer surface of each electrode 7 is provided a socket 9 which is outwardly protruded in a radial direction. An assembly of the electrodes 7 is coaxially inserted into a vacuum chamber 10 on which eight current feeding terminals 11 are provided so that each terminal 11 is positioned to be radially aligned opposite to the socket 9 on the outer surface of the associated electrode 7. Each terminal 11 is provided with a plug 12 which is intended to be connected to the associated socket 9.

In the illustrated embodiments described above, the octapole electrostatic deflectors are employed. It should, however, be understood that it is possible to use multiple pole electrostatic deflectors which comprise poles less than or more than eight poles.

According to the parallel sweeping system for the electrostatic sleeping ion implantors of the present invention as described above, it is appreciated that there can be obtained a uniform electric field which extends over 70% or more in the deflectors, and the effective range for the parallel sweeping can be widened as compared with the case of the parallel flat plate deflector, thereby reducing in size the rear state or second multiple pole electrostatic deflector.

Further, the capacity between the electrodes can be reduced so as to avoid that the triangular or sawtooth wave voltage becomes blunt. Furthermore, since the first and second multiple pole electrostatic deflectors are formed similarly in configuration, the same power source can be used for applying the same voltage to the associated electrodes of the first and second multiple pole electrostatic deflectors, and then simplification of the deflector system can be achieved.

The terms and expressions which have been employed herein are used as terms of description and not of limitation, and there is no intention, in the use of such terms and expressions, of excluding any equivalents of the features shown and described but it is recognized that various modifications are possible within the scope of the invention claimed.

What is claimed is:

1. A parallel sweeping system for electrostatic sweeping ion implanters, comprising:
    (a) an ion source for generating charged ion beams,
    (b) a first electrostatic deflector comprising a plurality of more than four electrodes equally spaced around an optical axis,
    (c) a second electrostatic deflector comprising the same plurality of electrodes also equally spaced around said optical axis and axially spaced from said first deflector.
    (d) means for electrically connecting pairs of said electrodes, one on said first deflector to the one on the opposite side of said axis of said second deflector,
    (e) means for applying different predetermined voltages to each connected pair of electrodes, and
    (f) a target wafer to be raster-scanned by said ion beams with exact parallelism to said optical axis.

2. A system according to claim 1 wherein said electrodes have a rectangular cross-section with rounded corners.

3. A system according to claim 1 wherein the number of electrodes is eight in each deflector.

4. A system according to claim 1 wherein said optical axis is at an oblique angle to the plane of the surface of said wafer.

* * * * *

UNITED STATES PATENT AND TRADEMARK OFFICE
CERTIFICATE OF CORRECTION

PATENT NO.   :   4,942,342
DATED        :   July 17, 1990
INVENTOR(S)  :   Osamu TSUKAKOSHI It is certified that error appears in the above-identified patent and that said Letters Patent is hereby corrected as shown below:

Column 1, line 7, change "sleeping" to -- sweeping --;
         line 27, change "sleeping" to -- sweeping --;
         line 57, change "sleeping" to -- sweeping -- (both occurrences).

Column 2, lines 40 and 41, change "directions" to -- direction --;
         line 42, change ".the" to -- .The --;
         line 45, change "resect" to -- respect --;
         line 54, change "sleeping" to -- sweeping --;
         line 65, after "propagating" insert -- direction which is parallel to the axis, and then --.

Column 6, line 4, change "sleeping" to -- sweeping --;
         line 10, change "state" to -- stage --.

Signed and Sealed this

Third Day of December, 1991

*Attest:*

HARRY F. MANBECK, JR.

*Attesting Officer*      *Commissioner of Patents and Trademarks*